United States Patent
Petti

(10) Patent No.: US 8,536,448 B2
(45) Date of Patent: Sep. 17, 2013

(54) ZENER DIODE WITHIN A DIODE STRUCTURE PROVIDING SHUNT PROTECTION

(75) Inventor: Christopher J Petti, Mountian View, CA (US)

(73) Assignee: GTAT Corporation, Nashua, NH (US)

( * ) Notice: Subject to any disclaimer, the term of this patent is extended or adjusted under 35 U.S.C. 154(b) by 279 days.

(21) Appl. No.: 13/020,849

(22) Filed: Feb. 4, 2011

(65) Prior Publication Data

US 2012/0167969 A1 Jul. 5, 2012

Related U.S. Application Data

(63) Continuation-in-part of application No. 12/980,424, filed on Dec. 29, 2010, now Pat. No. 8,173,452.

(51) Int. Cl.
   *H01L 31/00* (2006.01)
(52) U.S. Cl.
   USPC .......................................................... 136/256
(58) Field of Classification Search
   USPC .......................................................... 136/256
   See application file for complete search history.

(56) References Cited

U.S. PATENT DOCUMENTS

| | | |
|---|---|---|
| 5,248,621 A | 9/1993 | Sano |
| 5,589,008 A | 12/1996 | Keppner |
| 6,486,008 B1 | 11/2002 | Lee |
| 6,833,312 B2 | 12/2004 | Yanagita et al. |
| 7,339,110 B1 | 3/2008 | Mulligan et al. |
| 7,732,301 B1 | 6/2010 | Pinnington et al. |
| 7,749,884 B2 | 7/2010 | Mathew et al. |
| 7,985,604 B2 | 7/2011 | Isaka et al. |
| 2004/0040593 A1 | 3/2004 | Ho et al. |
| 2008/0092949 A1 | 4/2008 | Cheung et al. |
| 2008/0160661 A1 | 7/2008 | Henley |
| 2008/0179547 A1 | 7/2008 | Henley |
| 2009/0194162 A1 | 8/2009 | Sivaram et al. |

(Continued)

FOREIGN PATENT DOCUMENTS

EP 2043161 A2 * 4/2009

OTHER PUBLICATIONS

Notice of Allowance and Fees dated Jan. 18, 2013 for U.S. Appl. No. 13/331,915.
Office Action dated Nov. 10, 2011 for U.S. Appl. No. 12/980,424.

(Continued)

*Primary Examiner* — Eli Mekhlin
(74) *Attorney, Agent, or Firm* — The Mueller Law Office, P.C.

(57) ABSTRACT

A structure to provide a Zener diode to avoid shunt formation is disclosed. An undoped or lightly doped monocrystalline thin semiconductor lamina is cleaved from a donor body which is not permanently affixed to a support element. The lamina may be annealed at high temperature to remove damage from a prior implant. At least one aperture is formed through the lamina, either due to flaws in the cleaving process, or intentionally following cleaving. Heavily doped amorphous silicon layers having opposite conductivity types are deposited on opposite faces of the lamina, one forming the emitter and one a base contact to a photovoltaic cell, while the lamina forms the base of the cell. The heavily doped layers contact in the aperture, forming a Zener diode. This Zener diode prevents formation of shunts, and may behave as a bypass diode if the cell is placed under heavy reverse bias, as when one cell in a series string is shaded while the rest of the string is exposed to sun.

18 Claims, 12 Drawing Sheets

(56) References Cited

U.S. PATENT DOCUMENTS

| | | |
|---|---|---|
| 2009/0197367 A1 | 8/2009 | Sivaram et al. |
| 2009/0277314 A1 | 11/2009 | Henley |
| 2010/0072401 A1 | 3/2010 | Parrill et al. |
| 2010/0159630 A1 | 6/2010 | Hilali et al. |
| 2010/0178723 A1 | 7/2010 | Henley |
| 2010/0224238 A1 | 9/2010 | Hilali et al. |
| 2010/0326510 A1 | 12/2010 | Agarwal et al. |

OTHER PUBLICATIONS

Ravi, K.V., "Thin Single Crystal Silicon Solar Cells on Ceramic Substrates," PowerPoint presentation, U.S. Department of Energy, Solar Energy Technologies Program Peer Review, May 25, 2010.
Solanki, C. S. et al., "Thin-film Free-standing Monocrystalline Si Solar Cells with Heterojunction Emitter," Prog. Photovolt: Res. Appl. 2005; 13:201-208.
U.S. Appl. No. 12/826,762, filed Jun. 30, 2010, titled "A Formed Ceramic Receiver Element Adhered to a Semiconductor Lamina", Agarwal et al.
Notice of allowance dated Mar. 22, 2012 for U.S. Appl. No. 12/980,424.
Office Action dated Feb. 29, 2012 for U.S. Appl. No. 12/980,424.
International Search Report and Written Opinion dated Aug. 17, 2012 for PCT Application No. PCT/US2011/066195.
International Search Report and Written Opinion dated Sep. 14, 2012 for PCT Application No. PCT/US2011/066957.
Notice of Allowance and Fees Due dated Jul. 19, 2012 for U.S. Appl. No. 13/331,909.
Office Action dated Jul. 19, 2012 for U.S. Appl. No. 13/331,915.
Office Action dated Oct. 25, 2012 for U.S. Appl. No. 13/331,915.
Notice of Allowance and Fees dated Apr. 29, 2013 for U.S. Appl. No. 13/450,414.

* cited by examiner

Embodiment of 7,842,585

Embodiment of 7,842,585

Embodiment of 7,842,585

Embodiment of 7,842,585

ZENER DIODE WITHIN A DIODE STRUCTURE PROVIDING SHUNT PROTECTION

RELATED APPLICATIONS

This application is a continuation-in-part of Murali et al., U.S. patent application Ser. No. 12/980,424, "A Method to Form a Device by Constructing a Support Element on a Thin Semiconductor Lamina," filed Dec. 29, 2010, now U.S. Pat. No. 8,173,452, issued May 8, 2012, owned by the assignee of the present invention and hereby incorporated by reference.

BACKGROUND OF THE INVENTION

The invention relates to a method to prevent electronic shunting in a device.

A conventional prior art photovoltaic cell includes a p-n diode. An example is shown in FIG. 1. A depletion zone forms at the p-n junction, creating an electric field. Incident photons (incident light is indicated by arrows) will knock electrons from the valence band to the conduction band, creating free electron-hole pairs. Within the electric field at the p-n junction, electrons tend to migrate toward the n region of the diode, while holes migrate toward the p region, resulting in current, called photocurrent. Typically the dopant concentration of one region will be higher than that of the other, so the junction is either a p+/n− junction (as shown in FIG. 1) or a n+/p− junction. The more lightly doped region is known as the base of the photovoltaic cell, while the more heavily doped region, of opposite conductivity type, is known as the emitter. Most carriers are generated within the base, and it is typically the thickest portion of the cell. The base and emitter together form the active region of the cell. The cell also frequently includes a heavily doped contact region in electrical contact with the base, and of the same conductivity type, to improve current flow. In the example shown in FIG. 1, the heavily doped contact region is n-type.

Many different schemes are used to make ohmic contact to the cell. In some schemes, due to defects in the cell, electrical shunts may inadvertently be formed. A method to avoid formation of shunts is desirable.

SUMMARY OF THE INVENTION

The present invention is defined by the following claims, and nothing in this section should be taken as a limitation on those claims. In general, the invention is directed to a structure that minimizes or avoids shunt formation in a photovoltaic cell comprising a thin lamina.

A first aspect of the invention provides for a structure to prevent electrical shunting, the structure comprising: a monocrystalline semiconductor lamina having a first surface and a second surface opposite the first, and having a thickness between the first surface and the second surface less than about 50 microns; a first amorphous silicon layer on and in contact with the first surface, at least a portion of the first amorphous silicon layer heavily doped to a first conductivity type; a second amorphous silicon layer on and in contact with the second surface, at least a portion of the second amorphous silicon layer heavily doped to a second conductivity type, opposite the first conductivity type; a first contact in electrical contact with the first amorphous silicon layer; and a second contact in electrical contact with the second amorphous silicon layer, wherein the first amorphous silicon layer contacts the second amorphous silicon layer through an aperture in the lamina, forming a Zener diode, and in normal operation of the device, the second amorphous silicon layer is not in ohmic contact with the first contact.

Another aspect of the invention provides for a photovoltaic cell comprising: a monocrystalline silicon lamina having a thickness between about 2 and about 20 microns, the lamina having a first surface and a second surface opposite the first, the lamina comprising a base region of the photovoltaic cell; a first amorphous silicon layer on and in contact with the first surface, wherein at least half a thickness of the first amorphous silicon layer is heavily doped to a first conductivity type; a second amorphous silicon layer on and in contact with the first surface, wherein at least half a thickness of the second amorphous silicon layer is heavily doped to a second conductivity type opposite the first; a first contact in electrical contact with the first amorphous silicon layer; and a second contact in electrical contact with the second amorphous silicon layer, wherein the second amorphous silicon layer lines the sidewalls of an aperture in the lamina, and the first amorphous silicon layer does not line the sidewalls of the aperture in the lamina, and does not have a corresponding aperture aligned with the aperture in the lamina, and the first amorphous silicon layer and the second amorphous silicon layer are in contact through the aperture, forming a Zener diode, and wherein, during normal operation of the photovoltaic cell, the second amorphous silicon layer is not in ohmic contact with the first contact.

Each of the aspects and embodiments of the invention described herein can be used alone or in combination with one another.

The preferred aspects and embodiments will now be described with reference to the attached drawings.

DETAILED DESCRIPTION OF THE EMBODIMENTS

Figure 1:
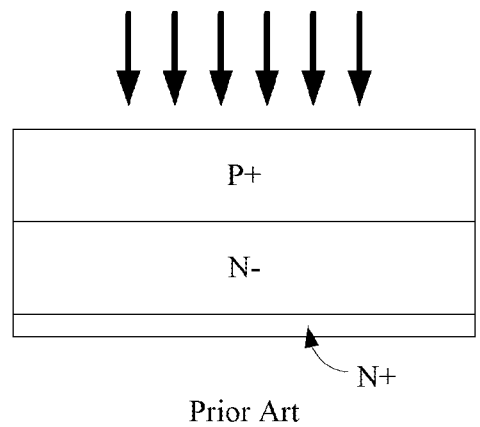
FIG. 1 is a cross-sectional view of a prior art photovoltaic cell.
Figure 2A:
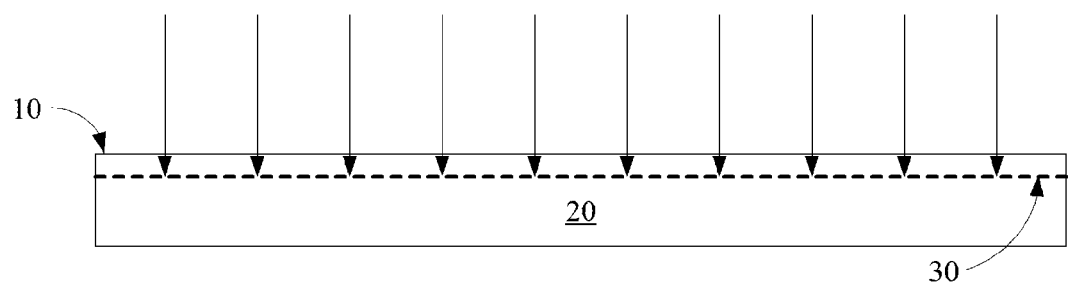
FIGS. 2a-2d are cross-sectional views showing stages in formation of the photovoltaic device of Sivaram et al., U.S. Pat. No. 7,842,585.
Figure 2B:
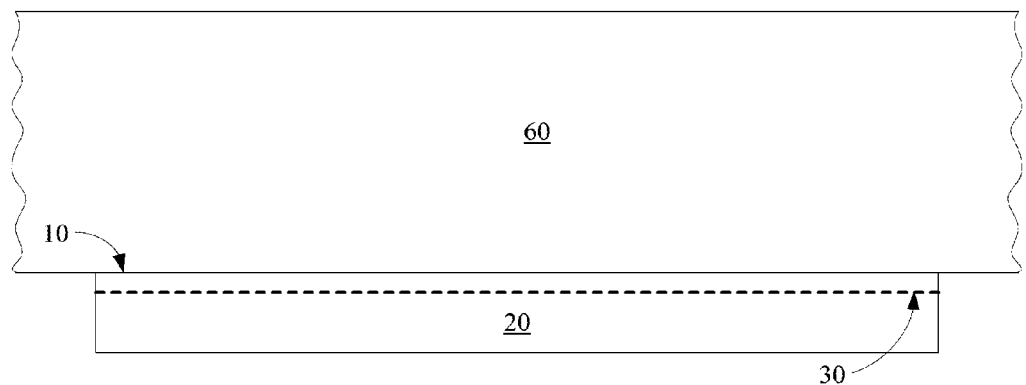
Figure 2C:
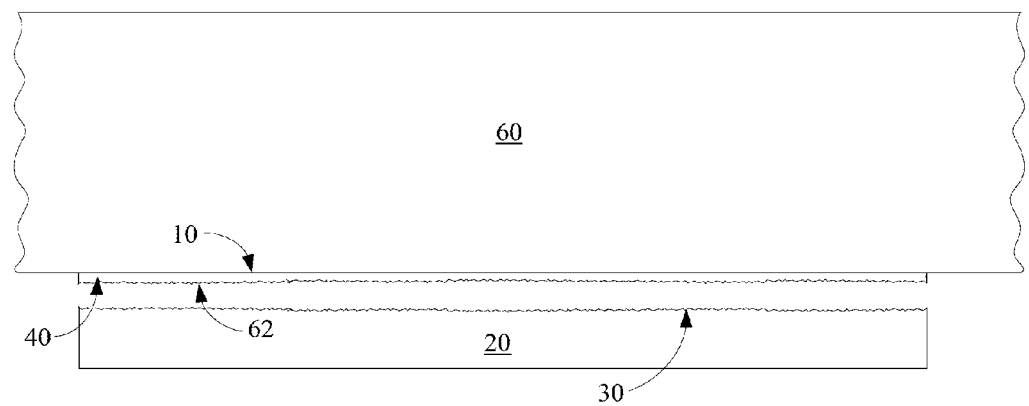
Figure 2D:
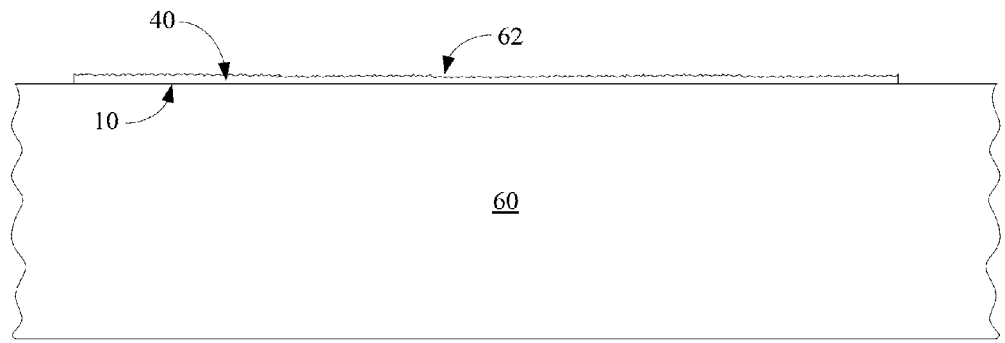

Sivaram et al., U.S. Pat. No. 7,842,585, "Method to Form a Photovoltaic Cell Comprising a Thin Lamina," describes fabrication of a photovoltaic cell comprising a thin semiconductor lamina formed of non-deposited semiconductor material. Referring to FIG. 2a, in embodiments of Sivaram et al., a semiconductor donor wafer 20 is implanted through first surface 10 with one or more species of gas ions, for example hydrogen and/or helium ions. The implanted ions define a cleave plane 30 within the semiconductor donor wafer. As shown in FIG. 2b, donor wafer 20 is affixed at first surface 10 to receiver 60. Referring to FIG. 2c, an anneal causes lamina 40 to cleave from donor wafer 20 at cleave plane 30, creating second surface 62. In embodiments of Sivaram et al., additional processing before and after the cleaving step forms a photovoltaic cell comprising semiconductor lamina 40, which is between about 0.2 and about 100 microns thick, for example between about 0.2 and about 50 microns, for example between about 1 and about 20 microns thick, in some embodiments between about 1 and about 10 microns thick or between about 3 and about 20 or between about 4 and about 12 microns thick, though any thickness within the named range is possible. FIG. 2d shows the structure inverted, with receiver 60 at the bottom, as during operation in some embodiments. Receiver 60 may be a discrete receiver element having a maximum width no more than 50 percent greater than that of donor wafer 10, and preferably about the same width, as described in Herner, U.S. patent application Ser. No. 12/057265, "Method to Form a Photovoltaic Cell Comprising a Thin Lamina Bonded to a Discrete Receiver Element," filed on Mar. 27, 2008, owned by the assignee of the present application and hereby incorporated by reference. Alternatively, a plurality of donor wafers may be affixed to a single, larger receiver, and a lamina cleaved from each donor wafer.

Using the methods of Sivaram et al., photovoltaic cells, rather than being formed from sliced wafers, are formed of thin semiconductor laminae without wasting silicon through kerf loss or by fabrication of an unnecessarily thick cell, thus reducing cost. The same donor wafer can be reused to form multiple laminae, further reducing cost, and may be resold after exfoliation of multiple laminae for some other use.

Cleaving is most easily achieved by heating, for example to temperatures of 400 degrees C. or more. It has been found that the step of implanting to define the cleave plane may cause damage to the crystalline lattice of the monocrystalline donor wafer. This damage, if unrepaired, may impair cell efficiency. A relatively high-temperature anneal of the lamina following cleaving, for example at 900 degrees C., 950 degrees C., or more, will repair most implant damage in the body of the lamina.

In embodiments of Sivaram et al., a first surface of the donor body is permanently affixed to a support element before cleaving of the lamina. As described in Murali et al., earlier incorporated, it is also possible to cleave the lamina from the donor body when the first surface is not permanently affixed to a support element.

Figure 3A:
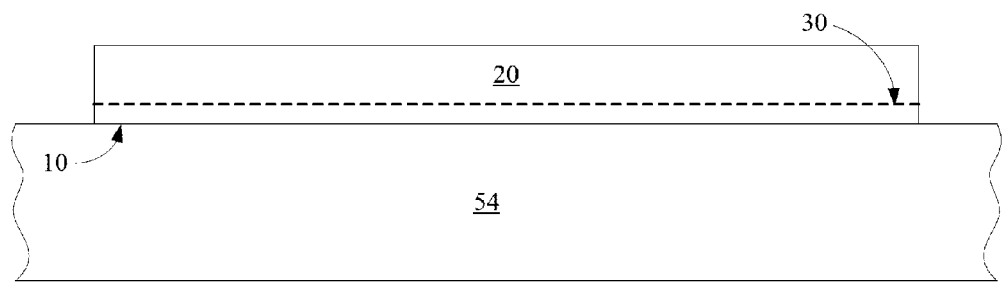
FIGS. 3a-3d are cross-sectional views showing stages in formation of a photovoltaic device according to embodiments of the present invention.
Figure 3B:
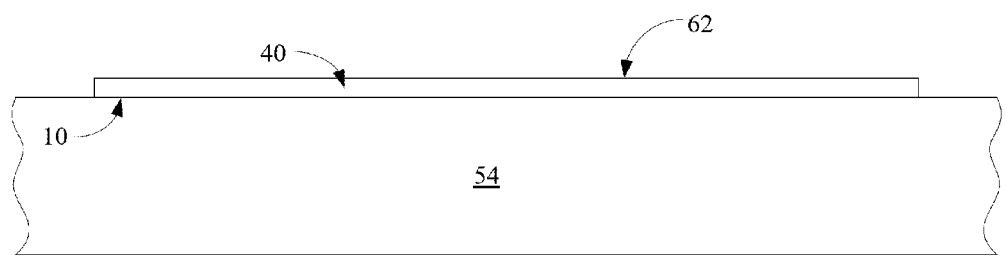

Turning to FIG. 3a, in the present invention, a donor wafer 20 is implanted through first surface 10 to form cleave plane 30. First surface 10 may be placed adjacent to vacuum chuck 54. As shown in FIG. 3b, a heating step is performed and lamina 40 separates from the donor wafer at the cleave plane, creating second surface 62. Referring to FIGS. 3a and 3b, note that during the cleaving step, first surface 10 of the donor wafer is not permanently affixed to a support element.

Figure 3C:
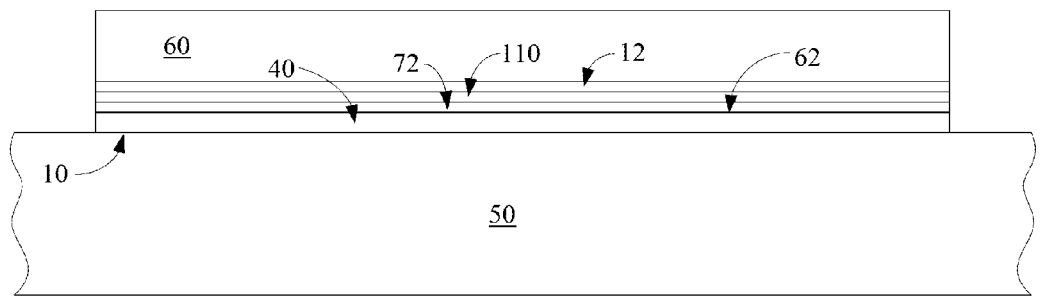

An anneal, for example at 900 degrees C. or higher, is performed to repair damage caused to the crystal lattice of lamina 40 during the implant step that formed cleave plane 30 of FIG. 3a. Following this anneal, lamina 40 may be transferred from the vacuum chuck and affixed to a temporary support element 50, as shown in FIG. 3c. As will be described in additional detail, one or more layers, including, for example, amorphous silicon layer 72, transparent conductive oxide (TCO) layer 110, and reflective metal layer 12, are deposited on lamina 40. A permanent support element 60 is constructed on lamina 40; in the embodiment shown, it is constructed directly on metal layer 12, which is formed over second surface 62 of lamina 40. A support element is considered to be "constructed" if it is formed in situ, rather than being provided as a pre-formed element. Examples include: a metal support element formed by plating, for example by electroplating or electroless plating; a ceramic support element formed by applying a ceramic mixture followed by curing in place; or a polymer support element formed by applying a the polymer in liquid or semi-liquid form and curing in place. Additional layers may be formed on or over amorphous silicon layer 72 before construction of support element 60. Support element 60 will be made sufficiently thick to provide mechanical support to lamina 40, which is too thin and fragile to survive much handling without such support.

Figure 3D:
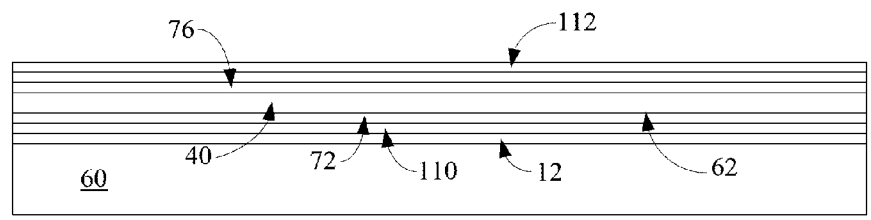

Turning to FIG. 3d, following construction of support element 60, lamina 40 is detached from temporary support element 50. FIG. 3d shows the structure inverted, with constructed support element 60 on the bottom, as in most embodiments. Additional layers, such as amorphous silicon layer 76 and ITO layer 112 are deposited, forming a photovoltaic cell.

Constructing support element 60 following the steps of cleaving and damage anneal, as in the present invention, provides several significant advantages. Note that the cell of FIG. 3d includes heavily doped amorphous silicon layers, 72 and 76, on opposing surfaces of lamina 40. Lamina 40 is more lightly doped than the amorphous silicon layers 72 and 76, and will serve as the base region of the photovoltaic cell. The base region of the cell absorbs incident light, and is where most charge carriers are generated. Lamina 40 is very thin, much thinner than the absorber region of a conventional photovoltaic cell. Thus, passivation of surfaces 10 and 62 of the lamina is particularly helpful to avoid loss of charge carriers by recombination at these surfaces. Amorphous silicon layers 72 and 76 are effective means of passivation, and their use is particularly advantageous with a very thin absorber.

Recall that in the embodiment of Sivaram et al., described above and referring to FIG. 2b, first surface 10 of donor wafer 20 is affixed to permanent support element 60 before cleaving and anneal. Thus, any layers deposited on first surface 10 before affixing to support element 60 will be exposed to the temperatures required by cleaving and anneal. This limits the materials that can be deposited on first surface 10. As explained above, amorphous silicon is advantageous for passivation of first surface 10. Amorphous silicon, however, cannot be exposed to the high temperature required to perform cleaving and damage anneal; such temperature will cause the amorphous silicon to crystallize. By cleaving and performing a damage anneal, both high temperature steps, before the lamina is permanently affixed to any support element, both surfaces of lamina 40 remain accessible for subsequent deposition of layers that cannot tolerate high temperature. This construction method also allows the use of other materials which cannot tolerate high temperature, such as aluminum or silver, which will tend to diffuse into silicon at high temperature, altering the electrical behavior of the cell.

Figure 4A:
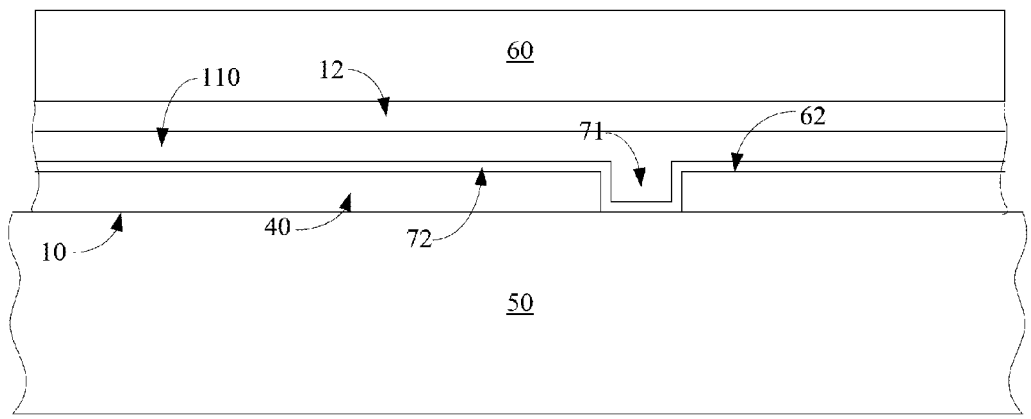
FIGS. 4a and 4b are cross-sectional views showing stages in formation of a photovoltaic device according to embodiments of the present invention, illustrating formation of a Zener diode in an aperture.

The exfoliation process may be imperfect, and at times there may be holes in the lamina following cleaving. The use of amorphous silicon layers on opposing faces of the lamina provides protection against electrical shunting. FIG. 4a shows lamina 40 affixed to temporary support element 50, with second surface 62 exposed. An aperture 71 has been formed through lamina 40. This aperture may have been formed unintentionally during cleaving, or may be formed intentionally. Heavily doped amorphous silicon layer 72 is deposited on second surface 62, and lines the sidewalls of aperture 71. Next TCO layer 110 is formed on heavily doped amorphous silicon layer 72, followed by reflective layer or stack 12, and finally by constructed permanent support element 60, which may be, for example, a metal support element formed by plating.

Figure 4B:
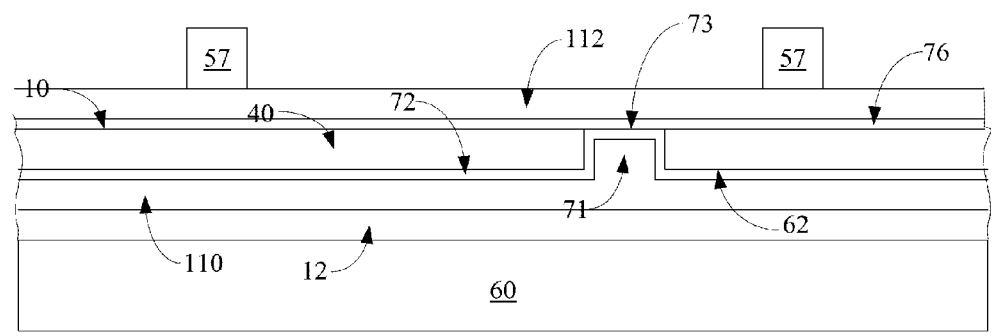

Turning to FIG. 4b, the temporary support element may now be removed. This figure shows the structure inverted, with permanent support element 60 on the bottom, as during operation in this embodiment. Heavily doped amorphous silicon layer 76 is deposited on second surface 62, followed by TCO layer 112 and wiring 57, completing the photovoltaic cell.

Amorphous silicon layers 72 and 76 are heavily doped to opposite conductivity types, while lamina 40 is undoped, or lightly or moderately doped. Thus lamina 40 will serve as the base region of the cell. One of amorphous silicon layer 72 or 76 will comprise the emitter of the photovoltaic cell, while the other provides electrical contact to the base region of the cell. For example, lamina 40 may be lightly n-doped, while amorphous silicon layer 72 is heavily n-doped and amorphous silicon layer 76 is heavily p-doped; in this example, amorphous silicon layer 76 comprises the emitter of the cell, and is at the light-facing surface of the cell. Amorphous silicon layer 76 is in electrical contact with wiring 57, which serve as first contacts. Amorphous silicon layer 72 is in electrical contact with metal layer 12, which serves as a second contact. Note that in each case a TCO layer, which is conductive, intervenes. Amorphous silicon layer 72 and amorphous silicon layer 76 are in contact through aperture 71. The contact between the p+ and n+ amorphous silicon layers forms a Zener diode 73. During normal operation of the pictured cell, in this example photocurrent will flow from second contact 12 through TCO layer 110 and amorphous silicon layer 72, entering lamina 40 at second surface 62 and exiting at first surface 10, through amorphous silicon layer 76 and TCO layer 112, to first contacts 57. If the polarities were to be reversed, current flow would also be reversed.

Note that during normal operation, voltage across Zener diode 73 is below its turn-on voltage, so little or no current flows across it. Note further that the Zener diode is electrically between the first contact and the second contact.

Figure 5:
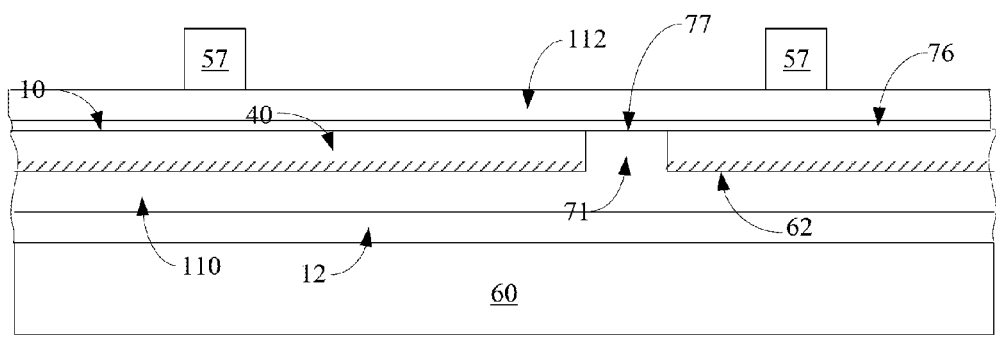
FIG. 5 is a cross-sectional view provided for illustration showing an imagined alternative which is not an embodiment of the present invention.

By using heavily doped amorphous silicon layers at both first surface 10 and second surface 62, both of which are deposited after formation of aperture 71, the structure provides shunt protection. For example, referring to FIG. 5, if the contact to the base region of the cell, which resides in lamina 40, were to be provided by heavily doped region 14, for example formed by dopant diffusion, rather than by heavily doped amorphous layer 72 (of FIG. 4b), it will be seen that amorphous layer 76 directly contacts TCO layer 110, resulting in a shunt 77. Current can flow directly between metal layer 12 and wiring 57 by way of TCO layer 110, heavily doped amorphous layer 76, and TCO layer 112. This current path bypasses the diode formed by heavily doped p-type amorphous layer 76, the emitter of the photovoltaic cell and lightly doped n-type lamina 40, the cell's base region.

Figure 6:
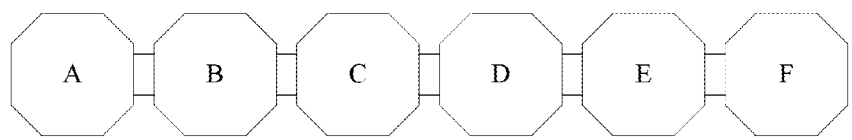
FIG. 6 is a plan view of six photovoltaic cells connected in series.

The structure shown in FIG. 4b may also serve to provide protection in a set of cells connected in series when one cell of the string is suddenly shaded, as may happen when a leaf or some other object or substance blocks incident light. Referring to FIG. 6, cells A through F are connected in a series string. The same current must flow through all cells in the string. If one cell in the string, for example cell C, is shaded and suddenly produces much less photocurrent, it will match the current of the others by going into heavy reverse bias, which may damage the cell. To avoid this condition, it is known to include bypass diodes in a photovoltaic module. Such a bypass diode points in the opposite direction and has lower breakdown voltage. A Zener diode has low reverse breakdown voltage compared to a typical n+/p− or p+/n− diode. Referring to FIG. 4b, if the cell is placed under heavy reverse diode, the Zener diode 73 formed at the junction of amorphous layers 72 and 76 in aperture 71 will break down at a lower reverse voltage than the main cell, thus protecting the main cell. Thus, it may be desirable to deliberately form apertures 71 in a cell including a thin lamina in order to form the protective Zener diode shown in FIG. 4b. Such apertures may be formed using a laser. Alternatively, such apertures may be unintentionally formed during the cleaving process.

What has been described is a structure to prevent electrical shunting, the structure comprising: a monocrystalline semiconductor lamina having a first surface and a second surface opposite the first, and having a thickness between the first surface and the second surface less than about 50 microns; a first amorphous silicon layer on and in contact with the first surface, at least a portion of the first amorphous silicon layer heavily doped to a first conductivity type; a second amorphous silicon layer on and in contact with the second surface, at least a portion of the second amorphous silicon layer heavily doped to a second conductivity type, opposite the first conductivity type; a first contact in electrical contact with the first amorphous silicon layer; and a second contact in electrical contact with the second amorphous silicon layer, wherein the first amorphous silicon layer contacts the second amorphous silicon layer through an aperture in the lamina, forming a Zener diode, and in normal operation of the device, the second amorphous silicon layer is not in ohmic contact with the first contact. The lamina is disposed between the first contact and the second contact. There is no aperture in either the first or the second amorphous layer corresponding to the aperture in the lamina.

For clarity, detailed examples of a photovoltaic assembly including a lamina having thickness between 0.2 and 100 microns, in which a Zener diode is formed at the junction of amorphous silicon layers having opposite doping which meet in an aperture through a monocrystalline semiconductor lamina, will be provided. For completeness, many materials, conditions, and steps will be described. It will be understood, however, that many of these details can be modified, augmented, or omitted while the results fall within the scope of the invention.

EXAMPLE

The process begins with a donor body of an appropriate semiconductor material. An appropriate donor body may be a monocrystalline silicon wafer of any practical thickness, for example from about 200 to about 1000 microns thick or more. Typically the wafer has a <100> orientation, though wafers of other orientations may be used. Different crystalline orientations may be selected, for example, to avoid channeling during the implant step to come. In alternative embodiments, the donor wafer may be thicker; maximum thickness is limited only by practicalities of wafer handling, and may be, for example, 10,000 microns or more. Alternatively, polycrystalline or multicrystalline silicon may be used, as may microcrystalline silicon, or wafers or ingots of other semiconductor materials, including germanium, silicon germanium, or III-V or II-VI semiconductor compounds such as GaAs, InP, etc. In this context the term multicrystalline typically refers to semiconductor material having grains that are on the order of a millimeter or larger in size, while polycrystalline semiconductor material has smaller grains, on the order of a thousand angstroms. The grains of microcrystalline semiconductor material are very small, for example 100 angstroms or so. Microcrystalline silicon, for example, may be fully crystalline or may include these microcrystals in an amorphous matrix. Multicrystalline or polycrystalline semiconductors are understood to be completely or substantially crystalline. It will be appreciated by those skilled in the art that the term "monocrystalline silicon" as it is customarily used will not exclude silicon with occasional flaws or impurities such as conductivity-enhancing dopants.

The process of forming monocrystalline silicon generally results in circular wafers, but the donor body can have other shapes as well. For photovoltaic applications, cylindrical monocrystalline ingots are often machined to an octagonal, or pseudosquare, cross section prior to cutting wafers. Wafers may also be other shapes, such as square. Square wafers have the advantage that, unlike circular or hexagonal wafers, they can be aligned edge-to-edge on a photovoltaic module with minimal unused gaps between them. The diameter or width of the wafer may be any standard or custom size. For simplicity this discussion will describe the use of a monocrystalline silicon wafer as the semiconductor donor body, but it will be understood that donor bodies of other types and materials can be used.

Figure 7A:
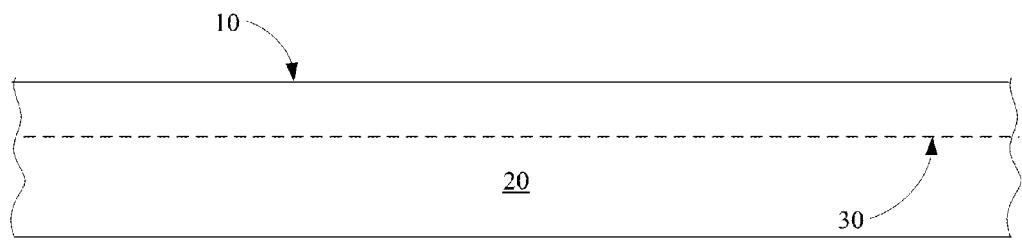
FIGS. 7a-7e are cross-sectional views showing stage in formation of a photovoltaic device having a constructed metal support element according to embodiments of the present invention.

Referring to FIG. 7a, donor wafer 20 is a monocrystalline silicon wafer which is lightly to moderately doped to a first conductivity type. The present example will describe a relatively lightly n-doped wafer 20 but it will be understood that in this and other embodiments the dopant types can be reversed. Wafer 20 may be doped to a concentration of between about $1 \times 10^{15}$ and about $1 \times 10^{18}$ dopant atoms/cm$^3$, for example about $1 \times 10^{17}$ dopant atoms/cm$^3$. Donor wafer 20 may be, for example, solar- or semiconductor-grade silicon.

In the next step, ions, preferably hydrogen or a combination of hydrogen and helium, are implanted into wafer 20 through first surface 10 to define cleave plane 30, as described earlier. This implant may be performed using the teachings of Parrill et al., U.S. patent application Ser. No. 12/122,108, "Ion Implanter for Photovoltaic Cell Fabrication," filed May 16, 2008; or those of Ryding et al., U.S. patent application Ser. No. 12/494,268, "Ion Implantation Apparatus and a Method for Fluid Cooling," filed Jun. 30, 2009; or of Purser et al. U.S. patent application Ser. No. 12/621,689, "Method and Apparatus for Modifying a Ribbon-Shaped Ion Beam," filed Nov. 19, 2009, all owned by the assignee of the present invention and hereby incorporated by reference. The overall depth of cleave plane 30 is determined by several factors, including implant energy. The depth of cleave plane 30 can be between about 0.2 and about 100 microns from first surface 10, for example between about 0.5 and about 20 or about 50 microns, for example between about 1 and about 10 microns, between about 1 or 2 microns and about 5 or 6 microns, or between about 4 and about 8 microns. Alternatively, the depth of cleave plane 30 can be between about 5 and about 15 microns, for example about 11 or 12 microns.

Texture (not shown) may be formed at first surface 10 to minimize reflection. A method for forming advantageous low-relief texture is disclosed in Li et al., U.S. patent application Ser. No. 12/729,878, "Creation of Low-Relief Texture for a Photovoltaic Cell," filed Mar. 23, 2010, owned by the assignee of the present invention and hereby incorporated by reference. The method of Li et al. includes buffing the surface, which may induce stress, tending to provide nucleation points for a crystallographically selective etch. Following texturing, at least 50 percent of first surface 10 has a peak-to-valley height between about 3000 angstroms and about 1 micron. In practice, nearly all of first surface 10 is textured.

Figure 7B:
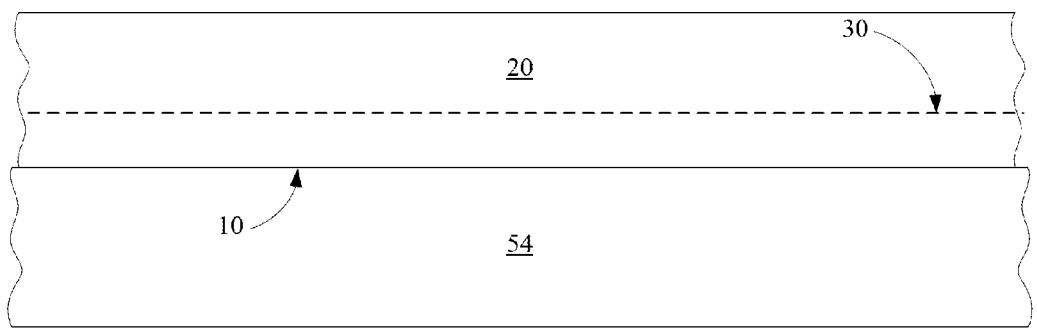

Turning to FIG. 7b, following the texture etch, first surface 10 may be placed adjacent to vacuum chuck 54, and a vacuum applied to hold donor wafer 20 in place. Vacuum chuck 54 and donor wafer 20 may be enclosed, for example in a quartz envelope.

Figure 7C:
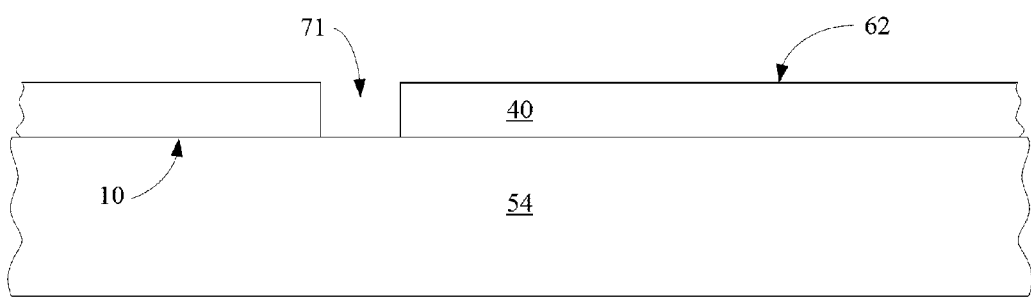

Referring to FIG. 7c, a thermal step causes monocrystalline silicon lamina 40 to cleave from the donor wafer at the cleave plane. Cleaving is achieved in this example by exfoliation, which may be achieved at temperatures between, for example, about 350 and about 650 degrees C., for example, about 550 degrees C. In general, exfoliation proceeds more rapidly at higher temperature. During cleaving, pressure may be applied by using a plate attached to a piston that will press donor wafer 20 to vacuum chuck 54. Pressures in the range of about 1 to about 100 psi, for example 40 psi, could be applied. The thickness of lamina 40 is determined by the depth of cleave plane 30. In many embodiments, the thickness of lamina 40 is between about 1 and about 10 microns, for example between about 2 and about 5 microns, for example about 4.5 microns. In other embodiments, the thickness of lamina 40 is between about 4 and about 20 microns, for example between about 10 and about 15 microns, for example about 11 microns. Second surface 62 is created by cleaving. As shown, an aperture 71 may form in lamina 40 during cleaving. In some embodiments, aperture 71 may be formed intentionally, for example by laser. For simplicity, only one aperture 71 is shown, but in practice there may be many more.

An anneal step may be performed to repair damage caused to the crystal lattice throughout the body of lamina 40 during the implant step Annealing may be performed while lamina 40 remains in place on vacuum chuck 54, for example, at 500 degrees C. or greater, for example at 550, 600, 650, 700, 800, 850 degrees C. or greater, at about 950 degrees C. or more. The structure may be annealed, for example, at about 650 degrees C. for about 45 minutes, or at about 800 degrees for about ten minutes, or at about 950 degrees for 120 seconds or less. In many embodiments the temperature exceeds 900 degrees C. for at least 60 seconds.

Figure 7D:
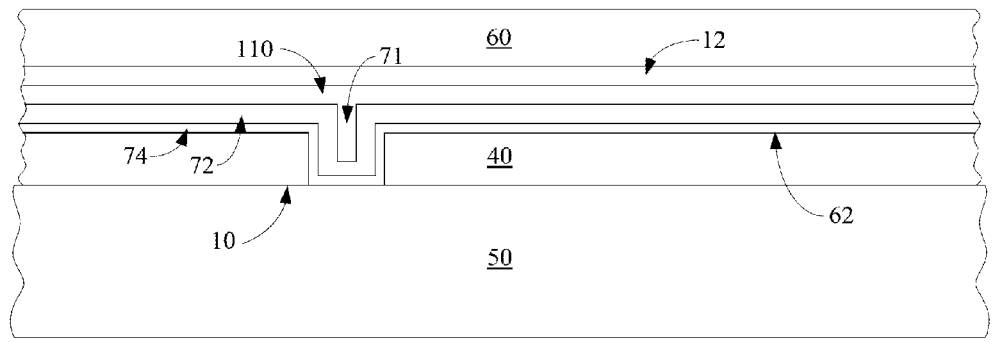

Next lamina 40 is removed from vacuum chuck 54. This may be done, for example, using a vacuum paddle, not shown. To affect this transfer, the vacuum paddle is placed on second surface 62, while the vacuum on first surface 10 is released. Following transfer to the vacuum paddle, second surface 62 is held by vacuum, while first surface 10 is exposed. Referring to FIG. 7d, lamina 40 is then transferred from the vacuum paddle to a temporary carrier 50. It is affixed to temporary carrier 50, for example using an adhesive. This adhesive must tolerate moderate temperature (up to about 200 degrees C.) and must be readily releasable. Suitable adhesives include, for example, polyester with maleic anhydride and rosin, which is hydrocarbon-soluble; or polyisobutylene and rosin, which is detergent soluble. Temporary carrier 50 may be any suitable material, for example glass, metal, polymer, silicon, etc. Following transfer, first surface 10 will be held to temporary carrier 50 by adhesive, while second surface 62 is exposed.

An etch step to remove damage caused by exfoliation may be performed, for example by a mix of hydrofluoric (HF) acid and nitric acid, or using KOH. It may be found that annealing is sufficient to remove all or nearly all damage and this etch is unnecessary. At minimum, the surface is cleaned of organic materials and residual oxide, using a dilute HF solution; for example, 10:1 HF for two minutes. Following this wet process, an amorphous silicon layer is deposited on second surface 62. This layer 72 is heavily doped silicon and may have a thickness, for example, between about 50 and about 350 angstroms. FIG. 7d shows an embodiment that includes intrinsic or nearly intrinsic amorphous silicon layer 74 between first surface 10 and doped layer 72, and in immediate contact with both. In this case, layers 72 and 74 together make up an amorphous layer consisting of a first thickness of amorphous intrinsic silicon and a second thickness of heavily doped amorphous silicon. In other embodiments, layer 74 may be omitted. In this example, heavily doped silicon layer 72 is heavily doped n-type, the same conductivity type as lightly doped n-type lamina 40. Lightly doped n-type lamina 40 comprises the base region of the photovoltaic cell to be formed, and heavily doped amorphous silicon layer 72 provides electrical contact to the base region. If included, layer 74 is sufficiently thin that it does not impede electrical connection between lamina 40 and heavily doped silicon layer 72.

Note that heavily doped amorphous silicon layer 72, and intrinsic layer 74, line the sidewalls of aperture 71.

A TCO layer 110 is formed on and in immediate contact with amorphous silicon layer 74. Appropriate materials for TCO 110 include indium tin oxide and aluminum-doped zinc oxide. This layer may be, for example, about between about 500 to about 1500 angstroms thick, for example about 750 angstroms thick. This thickness will enhance internal reflection from a reflective layer to be deposited. In some embodiments this layer may be substantially thinner, for example about 100 to about 200 angstroms.

As will be seen, in the completed device, incident light will enter lamina 40 at first surface 10. After passing through lamina 40, light that has not been absorbed will exit lamina 40 at second surface 62, then pass through TCO layer 110. A reflective layer 12 formed on TCO layer 110 will reflect this light back into the cell for a second opportunity to be absorbed, improving efficiency. A conductive, reflective metal may be used for reflective layer 12. Various layers or stacks may be used. In one embodiment, reflective layer 12 is formed by depositing a very thin layer of chromium, for example about 30 or 50 angstroms to about 100 angstroms, on TCO layer 110, followed by about 1000 to about 3000 angstroms of silver. In an alternative embodiment, not pictured, reflective layer 12 may be aluminium, having a thickness of about 1000 to about 3000 angstroms. In the next step, a layer will be formed by plating. Conventional plating cannot be performed onto an aluminum layer, so if aluminum is used for reflective layer 12, an additional layer or layers must be added to provide a seed layer for plating. In one embodiment, for example, a layer of titanium, for example between about 200 and about 300 angstroms thick, followed by a seed layer, for example of cobalt, which may have any suitable thickness, for example about 500 angstroms.

Metal support element 60 is formed by plating on reflective layer 12 (a chromium/silver stack in this embodiment). To form metal support element 60 by electroplating, temporary carrier 50 and lamina 40, and associated layers, are immersed in an electrolyte bath. An electrode is attached to reflective layer 12, and a current passed through the electrolyte. Ions from the electrolyte bath build up on reflective layer 12, forming metal support element 60. Metal support element 60 may be, for example, an alloy of nickel and iron. Iron is cheaper, while the coefficient of thermal expansion of nickel is better matched to that of silicon, reducing stress during later steps. The thickness of metal support element 60 may be as desired. Metal support element 60 should be thick enough to provide structural support for the photovoltaic cell to be formed. A thicker support element 60 is less prone to bowing. In contrast, minimizing thickness reduces cost. One skilled in the art will select a suitable thickness and iron:nickel ratio to balance these concerns. Thickness may be, for example, between about 25 and about 100 microns, for example about 50 microns. In some embodiments, the iron-nickel alloy is between about 55 and about 65 percent iron, for example 60 percent iron.

Figure 7E:
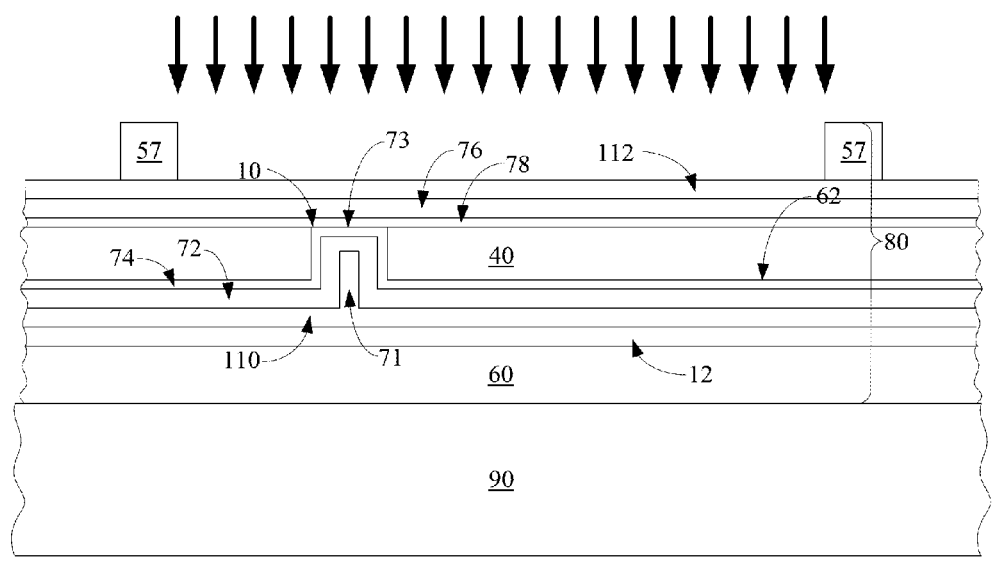

Turning to FIG. 7e, following construction of metal support element 60, temporary carrier 50 can be removed, exposing first surface 10. FIG. 7e shows the structure inverted, with metal support element 60 on the bottom, as it will be during operation. Lamina 40 is detached from temporary support element 50. In some embodiments, heating, for example to about 225 C, will cause the adhesive to soften, aiding removal. First surface 10 is cleaned, for example using a detergent, followed by a rinse. In some case a solvent may be used, such as photoresist stripper. Temporary support element 50 is also cleaned, using the same methods, and subsequently re-used.

Following cleaning, an amorphous silicon layer is deposited on first surface 10. This layer 76 is heavily doped silicon and may have a thickness, for example, between about 50 and about 350 angstroms. FIG. 7e shows an embodiment that includes intrinsic or nearly intrinsic amorphous silicon layer 78 between first surface 62 and doped layer 76, and in immediate contact with both. In this case, layers 76 and 78 together make up an amorphous layer consisting of a first thickness of amorphous intrinsic silicon and a second thickness of heavily doped amorphous silicon. In other embodiments, layer 78 may be omitted. In this example, heavily doped silicon layer 76 is heavily doped p-type, opposite the conductivity type of lightly doped n-type lamina 40, and serves as the emitter of the photovoltaic cell. If included, layer 78 is sufficiently thin that it does not impede electrical connection between lamina 40 and heavily doped silicon layer 76. The term "heavily doped" when referring to amorphous silicon layers can be considered to mean doped to at least $10^{18}$ dopant atoms/cm$^3$.

Note that in aperture 71, the amorphous silicon layer or layers formed on first surface 10, layer 76 and layer 78 (if present), make immediate contact with the amorphous silicon layer or layers earlier formed on second surface 62, layer 72 and layer 74 (if present). A Zener diode 73 is formed at this contact. If undoped amorphous silicon layers 78 and 72 are present, they are sufficiently thin so as not to impede the function of Zener diode 73.

A transparent conductive oxide (TCO) layer 112 is formed on and in immediate contact with amorphous silicon layer 76. Appropriate materials for TCO 112 include indium tin oxide and aluminum-doped zinc oxide. This layer may be, for example, about between about 700 to about 1800 angstroms thick, for example about 900 angstroms thick. In some embodiments, a layer having a refractive index between that of amorphous silicon layer 76 and TCO layer 112, may be formed on amorphous silicon layer 76, as described in Liang et al., U.S. patent application Ser. No. 12/894,254, "A Semiconductor with a Metal Oxide Layer Having Intermediate Refractive Index," filed Sep. 30, 2010, owned by the assignee of the present application and hereby incorporated by reference.

Metal lines 57, for example of silver paste, may be formed on TCO layer 112, for example by screen printing, and cured at a relatively low temperature, for example about 180-250 degrees C.

A photovoltaic cell has been formed, including lightly doped n-type lamina 40, which comprises the base of the cell, and heavily doped p-type amorphous silicon layer 76, which serves as the emitter of the cell. Heavily doped n-type amorphous silicon layer 72 will provide good electrical contact to the base region of the cell. Electrical contact must be made to both faces of the cell. Contact to amorphous silicon layer 76 is made by gridlines 57, by way of TCO layer 112. Metal support element 60 is conductive and is in electrical contact with base contact 72 by way of conductive layer 12 and TCO layer 110. A Zener diode is formed in aperture 71, and in any other apertures, at the junction of heavily doped amorphous layers 72 and 76, which are doped to opposite conductivity types. Intrinsic layers 74 and 78, if present, are sufficiently thin that they do not prevent this junction from behaving as a Zener diode.

FIG. 7e shows completed photovoltaic assembly 80, which includes a photovoltaic cell and metal support element 60. In alternative embodiments, by changing the dopants used, heavily doped amorphous silicon layer 72 may serve as the emitter, while heavily doped silicon layer 76 serves as a contact to the base region. Incident light (indicated by arrows) falls on TCO 112, enters the cell at heavily doped p-type amorphous silicon layer 76, enters lamina 40 at first surface 10, and travels through lamina 40. Reflective layer 12 will serve to reflect some light back into the cell. In this embodiment, receiver element 60 serves as a substrate. Receiver element 60 and lamina 40, and associated layers, form a photovoltaic assembly 80. Multiple photovoltaic assemblies 80 can be formed and affixed to a supporting substrate 90 or, alternatively, a supporting superstrate (not shown). Each photovoltaic assembly 80 includes a photovoltaic cell. The photovoltaic cells of a module are generally electrically connected in series.

What has been described is a photovoltaic cell comprising: a monocrystalline silicon lamina having a thickness between about 2 and about 20 microns, the lamina having a first surface and a second surface opposite the first, the lamina comprising a base region of the photovoltaic cell; a first amorphous silicon layer on and in contact with the first surface, wherein at least half a thickness of the first amorphous silicon layer is heavily doped to a first conductivity type; a second amorphous silicon layer on and in contact with the first surface, wherein at least half a thickness of the second amorphous silicon layer is heavily doped to a second conductivity type opposite the first; a first contact in electrical contact with the first amorphous silicon layer; and a second contact in electrical contact with the second amorphous silicon layer, wherein the second amorphous silicon layer lines the sidewalls of an aperture in the lamina, and the first amorphous silicon layer does not line the sidewalls of the aperture in the lamina, and does not have a corresponding aperture aligned with the aperture in the lamina, and the first amorphous silicon layer and the second amorphous silicon layer are in contact through the aperture, forming a Zener diode, and wherein, during normal operation of the photovoltaic cell, the second amorphous silicon layer is not in ohmic contact with the first contact.

Figure 8A:
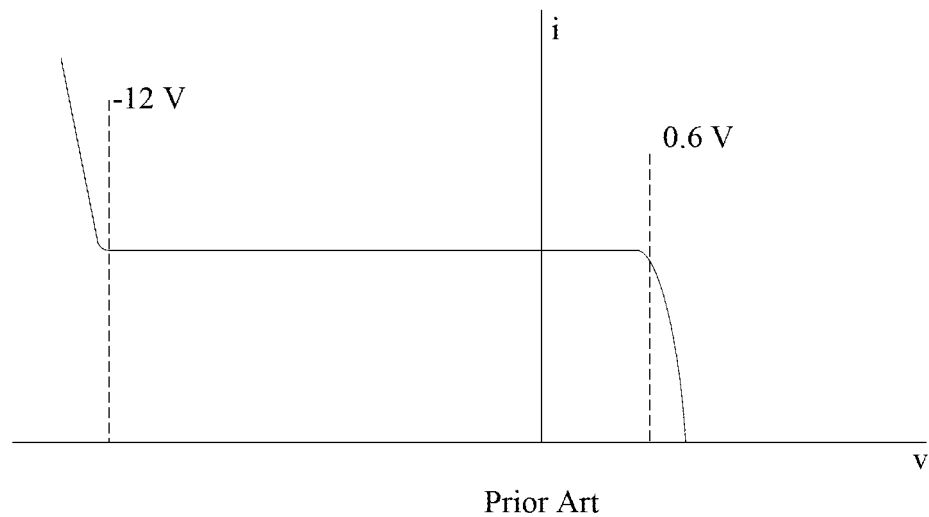
FIG. 8a is an IV curve of a prior art photovoltaic cell.
Figure 8B:
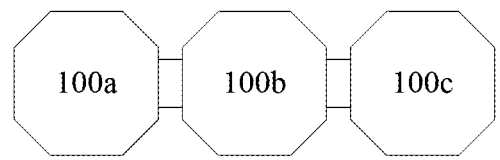
FIG. 8b is a plan view of a series string of such cells.
Figure 8C:
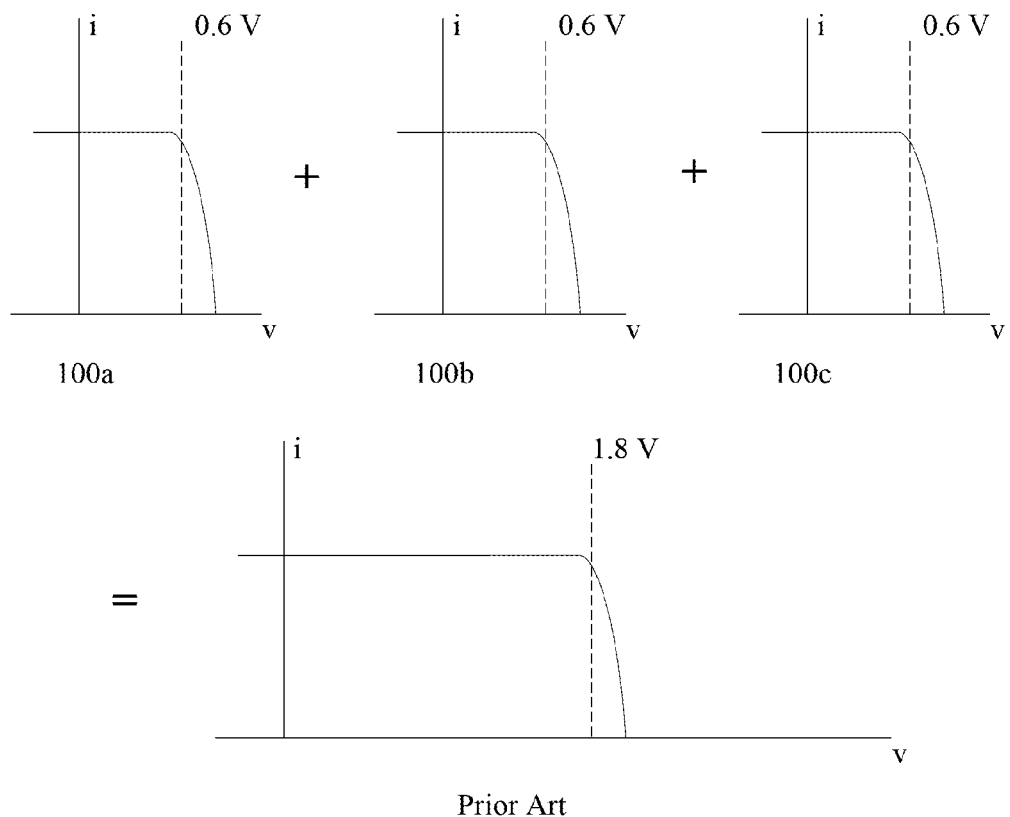
FIG. 8c is a series of IV curves for the string.
Figure 8D:
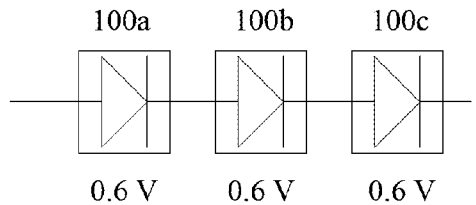
FIG. 8d is a circuit diagram for the string.

FIG. 8a depicts a typical IV curve for a prior art photovoltaic cell exposed to light. The cell operates at or near the maximum power point, which in this cell, for example, is at about 0.6 V. At negative voltage, current is nearly flat, until a very high reverse voltage, called the breakdown voltage, is reached. Note that the X-axis is not to scale. In the cell of FIG. 8a, the breakdown voltage is at about −12 V. FIG. 8b shows three cells 100a-100c connected in series, though in normal operation, a string will generally contain more than three cells. In normal operation, the IV curves of the three cells are as shown in FIG. 8c. As these cells are connected in series, the voltages will add, producing 1.8 V for the string. FIG. 8d is a circuit diagram of the string.

Figure 8E:
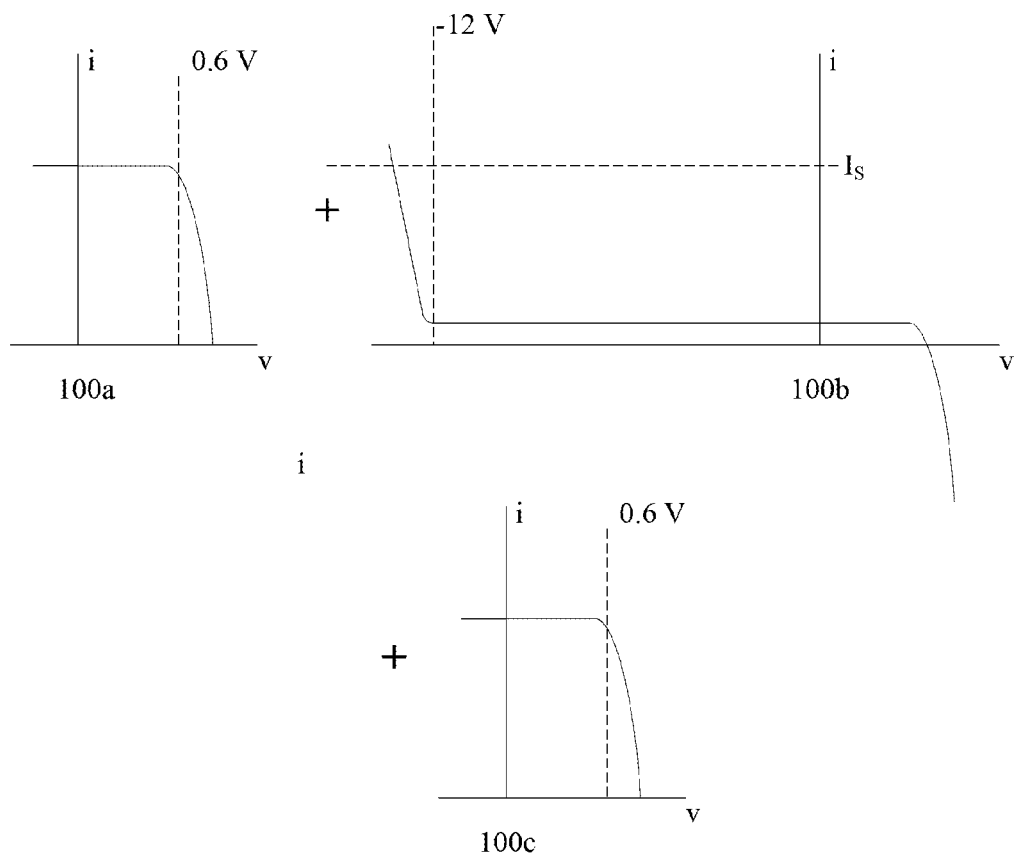
FIG. 8e shows IV curves when one cell is shaded.
Figure 8F:
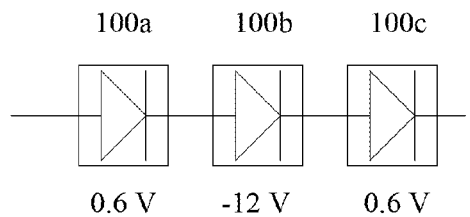
FIG. 8f shows a circuit diagram for this case.

Referring to FIG. 8b, if cell 100b is unexpectedly shaded, photocurrent produced by this cell will drop dramatically. In order to match the current in the rest of the string, cell 100b will go into heavy reverse bias FIG. 8e shows the IV curves of the two unshaded cells, 100a and 100c, and of the shaded cell, 100b. In this example, the current of the rest of the string, $I_S$, is reached at about −12 V in the shaded cell, 100b. FIG. 8f shows a circuit diagram of the series string. The heavy reverse bias will likely damage cell 100b.

Figure 9A:
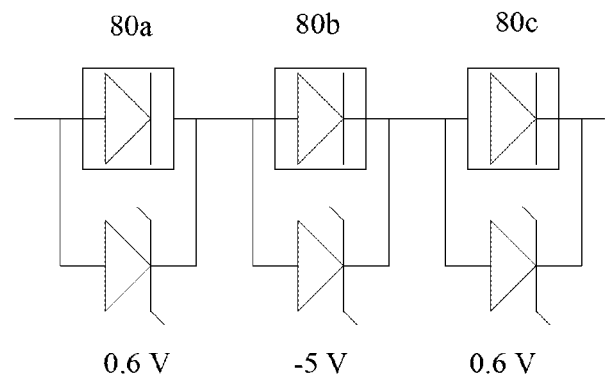
FIG. 9a is a circuit diagram of a series string of cells according to an embodiment of the present invention.
Figure 9B:
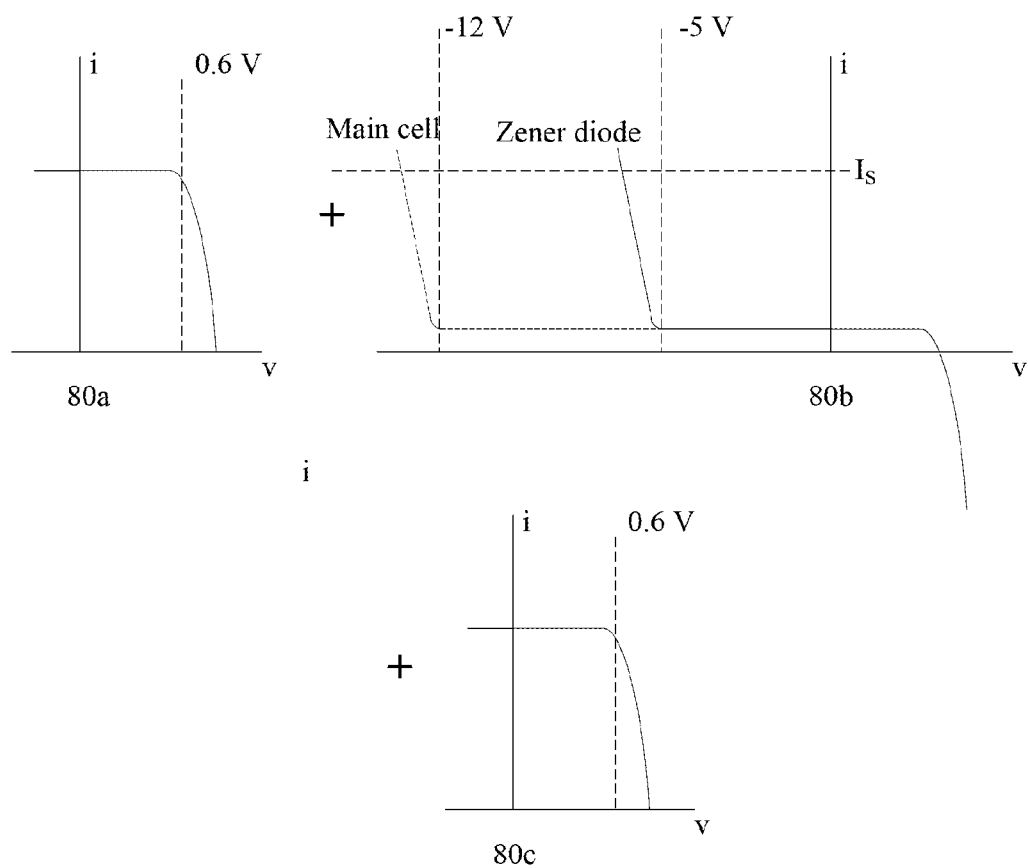
FIG. 9b shows the IV curves for the cells in this string when one cell is shaded.

A Zener diode will have a lower reverse breakdown voltage than the main diode. In a series string of cells formed according to the present invention, each cell is formed having a Zener diode formed in one or more apertures within each the cell. Each cell then has a Zener diode in parallel with the main cell, as shown in the circuit diagram of FIG. 9a. In a string including cells 80a-80c formed according to the present invention, when cell 80b is shaded, the Zener diode, under reverse bias, reaches current $I_S$ at a much lower reverse voltage, in this example about −5 V. These voltages are shown in FIG. 9a. This will help prevent damage to the main cell.

In the embodiments just described, texturing was performed before plating. In other embodiments, texturing may be performed following plating. The texturing method of Li et al. calls for a buffing step thought to introduce surface stress, which creates nucleation points for etching. When texturing is performed following plating, it may be found that the stress induced by plating may render the buffing step unnecessary, and a timed etching step with a selective etchant such as TMAH or KOH or NaOH may be sufficient to form pyramids having a peak-to-valley height less than one micron.

In the embodiment just described, a metal support element was constructed on the lamina by plating. In alternative embodiments, a support element may be formed from other materials. For example, a ceramic mixture may be applied to a lamina and cured to form a ceramic support element, or a polymer support element may be formed by applying a the polymer in liquid or semi-liquid form and curing in place. Embodiments are described in detail in Murali et al., earlier incorporated.

A variety of embodiments has been provided for clarity and completeness. Clearly it is impractical to list all possible embodiments. Other embodiments of the invention will be apparent to one of ordinary skill in the art when informed by the present specification. Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A structure to prevent electrical shunting, the structure comprising:

a monocrystalline semiconductor lamina having a first surface and a second surface opposite the first, and having a thickness between the first surface and the second surface less than about 50 microns;

a first amorphous silicon layer on and in contact with the first surface, at least a portion of the first amorphous silicon layer heavily doped to a first conductivity type;

a second amorphous silicon layer on and in contact with the second surface, at least a portion of the second amorphous silicon layer heavily doped to a second conductivity type, opposite the first conductivity type;

a first contact in electrical contact with the first amorphous silicon layer; and a second contact in electrical contact with the second amorphous silicon layer, wherein the first amorphous silicon layer directly contacts the second amorphous silicon layer through an aperture in the lamina, forming a Zener diode, the lamina comprises a base region of a photovoltaic cell, the aperture in the lamina does not correspond to an aperture in either the first or the second amorphous silicon layer, and in normal operation of the device, the second amorphous silicon layer is not in ohmic contact with the first contact.

2. The structure of claim 1 wherein the first amorphous silicon layer or the second amorphous silicon layer comprises an emitter of the photovoltaic cell.

3. The structure of claim 1 wherein the lamina is undoped or lightly or moderately doped silicon.

4. The structure of claim 1 wherein the lamina has a thickness between about 3 and about 20 microns.

5. The structure of claim 4 wherein the lamina has a thickness between about 4 and about 12 microns.

6. The structure of claim 1 wherein the lamina is disposed between the first contact and the second contact.

7. The structure of claim 1 wherein the first amorphous silicon layer consists of a first thickness of intrinsic amorphous silicon and a second thickness of heavily doped amorphous silicon.

8. The structure of claim 1 wherein the second amorphous silicon layer consists of a first thickness of intrinsic amorphous silicon and a second thickness of heavily doped amorphous silicon.

9. The structure of claim 1 wherein, during normal operation of the photovoltaic cell, voltage across the Zener diode is below its turn-on voltage.

10. The structure of claim 1 wherein the Zener diode is electrically between the first contact and the second amorphous silicon layer.

11. The structure of claim 1 wherein at least a portion of the first heavily doped amorphous layer is doped to at least $10^{18}$ atoms/cc$^3$, and wherein at least a portion of the second heavily doped amorphous layer is doped to at least $10^{18}$ atoms/cc$^3$.

12. The structure of claim 1 wherein, during normal operation of the cell, incident light first enters the lamina at the first surface, and wherein at least fifty percent of the first surface is textured, the texture having a peak-to-valley height between about 3000 angstroms and about 1 micron.

13. A photovoltaic cell comprising:

a monocrystalline silicon lamina having a thickness between about 2 and about 20 microns, the lamina having a first surface and a second surface opposite the first, the lamina comprising a base region of the photovoltaic cell;

a first amorphous silicon layer on and in contact with the first surface, wherein at least half a thickness of the first amorphous silicon layer is heavily doped to a first conductivity type;

a second amorphous silicon layer on and in contact with the first surface, wherein at least half a thickness of the second amorphous silicon layer is heavily doped to a second conductivity type opposite the first;

a first contact in electrical contact with the first amorphous silicon layer; and a second contact in electrical contact with the second amorphous silicon layer, wherein the second amorphous silicon layer lines the sidewalls of an aperture in the lamina, and the first amorphous silicon layer does not line the sidewalls of the aperture in the lamina, and does not have a corresponding aperture aligned with the aperture in the lamina, and the first amorphous silicon layer and the second amorphous silicon layer are in direct contact through the aperture, forming a Zener diode, and wherein, during normal operation of the photovoltaic cell, the second amorphous silicon layer is not in ohmic contact with the first contact.

14. The photovoltaic cell of claim 13 wherein the first amorphous silicon layer or the second amorphous silicon layer comprises an emitter of the photovoltaic cell.

15. The photovoltaic cell of claim 13 wherein the first amorphous silicon layer comprises the emitter of the photovoltaic cell, and wherein incident light first enters the lamina at the first surface.

16. The photovoltaic cell of claim 13 wherein either the first surface or the second surface is a light-facing surface, and wherein at least fifty percent of the light-facing surface is textured, the texture having a peak-to-valley height between about 3000 angstroms and about 1 micron.

17. The photovoltaic cell of claim 13 wherein, during normal operation of the cell, voltage across the Zener diode is below its turn-on voltage.

18. The photovoltaic cell of claim 13 wherein the photovoltaic cell is permanently affixed to a metal support element.

* * * * *